(12) United States Patent
Peeters et al.

(10) Patent No.: US 9,877,370 B2
(45) Date of Patent: Jan. 23, 2018

(54) LIGHTING DEVICE COMPRISING AT LEAST TWO SETS OF LEDS

(71) Applicant: KONINKLIJKE PHILIPS N.V., Eindhoven (NL)

(72) Inventors: Martinus Petrus Joseph Peeters, Weert (NL); René Theodorus Wegh, Veldhoven (NL); Raimond Louis Dumoulin, Maarheeze (NL); Marcellus Jacobus Johannes Van Der Lubbe, Best (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 101 days.

(21) Appl. No.: 14/898,172

(22) PCT Filed: Jun. 12, 2014

(86) PCT No.: PCT/EP2014/062238
§ 371 (c)(1),
(2) Date: Dec. 14, 2015

(87) PCT Pub. No.: WO2014/202456
PCT Pub. Date: Dec. 24, 2014

(65) Prior Publication Data
US 2016/0212804 A1    Jul. 21, 2016

(30) Foreign Application Priority Data

Jun. 20, 2013    (EP) .................................. 13172960

(51) Int. Cl.
*F21V 9/16*    (2006.01)
*H05B 33/08*    (2006.01)
(Continued)

(52) U.S. Cl.
CPC ........ *H05B 33/086* (2013.01); *C09K 11/0883* (2013.01); *C09K 11/7734* (2013.01);
(Continued)

(58) Field of Classification Search
CPC ..... H05B 33/086; F21K 9/64; C09K 11/0883; C09K 11/7734; C09K 11/7774;
(Continued)

(56) References Cited

U.S. PATENT DOCUMENTS

2004/0183085 A1    9/2004 Okazaki
2010/0207521 A1    8/2010 Tamaki et al.
(Continued)

FOREIGN PATENT DOCUMENTS

JP    2012009684 A    1/2012
JP    2012199539 A    10/2012

*Primary Examiner* — Y M. Lee (57) ABSTRACT

The invention provides a lighting device (100) comprising a first set of light emitting diodes (10) arranged to emit light (14) in a first wavelength range of 300 nm-490 nm, a second set of light emitting diodes (11) arranged to emit light (15) in a second wavelength range of 300 nm-490 nm, a first luminescent element (12) radiationally coupled to the first and second set of light emitting diodes and arranged to convert at least a part of the light of the first wavelength range and at least a part of the light of the second wavelength range into first luminescent element light, a second luminescent element (13) radiationally coupled to at least a subset of the second set of light emitting diodes and arranged to convert at least a part of the light (15) of the second wavelength range into second luminescent element light, wherein, during operation, the brightness level of the light (14) emitted by the first set of light emitting diodes (10) and the brightness level of the light (15) emitted by the second set of light emitting diodes (11), respectively, is controllable (Continued)

independently of each other and wherein the lighting device is arranged to generate white lighting device light (101).

14 Claims, 7 Drawing Sheets

(51) Int. Cl.
| | | |
|---|---|---|
| *H01L 25/075* | (2006.01) | |
| *C09K 11/08* | (2006.01) | |
| *C09K 11/77* | (2006.01) | |
| *F21K 9/64* | (2016.01) | |
| *H01L 33/50* | (2010.01) | |
| *F21S 8/06* | (2006.01) | |
| *F21Y 115/10* | (2016.01) | |

(52) U.S. Cl.
CPC ............ *C09K 11/7774* (2013.01); *F21K 9/64* (2016.08); *F21V 9/16* (2013.01); *H01L 25/0753* (2013.01); *F21S 8/06* (2013.01); *F21Y 2115/10* (2016.08); *H01L 33/504* (2013.01); *H01L 2224/48091* (2013.01)

(58) Field of Classification Search
CPC ...... F21S 8/06; H01L 33/504; H01L 25/0753; H01L 2224/48091; F21V 9/16; F21Y 2115/10

See application file for complete search history.

(56) References Cited

U.S. PATENT DOCUMENTS

| | | |
|---|---|---|
| 2011/0121758 A1 | 5/2011 | Bierhuizen et al. |
| 2012/0025218 A1 | 2/2012 | Ito et al. |
| 2012/0153311 A1 | 6/2012 | Yuan et al. |
| 2013/0001597 A1 | 1/2013 | Anc et al. |
| 2013/0093362 A1* | 4/2013 | Edwards ............ H01L 25/0753 362/84 |
| 2014/0299903 A1* | 10/2014 | Wu ..................... H01L 25/0753 257/98 |

* cited by examiner

LIGHTING DEVICE COMPRISING AT LEAST TWO SETS OF LEDS

CROSS-REFERENCE TO PRIOR APPLICATIONS

This application is the U.S. National Phase application under 35 U.S.C. §371 of International Application No. PCT/EP2014/062238, filed on Jun. 12, 2014, which claims the benefit of European Patent Application No. 13172960.0, filed on Jun. 20, 2013. These applications are hereby incorporated by reference herein.

FIELD OF THE INVENTION

The invention relates to a lighting device comprising at least two sets of light emitting diodes. The invention further relates to a lighting module comprising said lighting device. The invention further relates to a lamp comprising such lighting device. The invention further relates to a luminaire comprising said lighting device or said lighting module. The invention even further relates to a method for producing said lighting device.

BACKGROUND OF THE INVENTION

Light Emitting Diode (LED) based lighting devices are being used for many applications. The relatively low power consumption and relatively long lifetime of LEDs make them a very useful alternative for conventional light sources like incandescent lamps or fluorescent tubes. Hence, not only new-designed lighting equipment often utilizes LEDs, but in many markets LED products are being used to replace other light sources like incandescent or halogen light sources, for instance. These so-called retrofit products have to be compatible with existing lighting/power supply systems.

In many lighting applications, dimmed light is needed. Conventional incandescent and halogen lamps have an effect that, when being dimmed, the color temperature of the light follows the Black Body Locus (BBL), referred to as the "BBL dimming effect". The BBL dimming effect provides the visual effect of a warmer light generated by the lamp when dimmed than when being operated at maximum power, i.e. maximum light output level. This effect is used in ambiance light situations to provide a comfortable soft light, for instance in restaurants, lounges, living rooms etc.

The BBL dimming effect is also desired when using LED-based lighting devices. However, the LED light sources will provide light of substantially the same correlated color temperature regardless of the light output level. Therefore, to provide the BBL dimming effect, an amber LED light source may be provided in the LED-based lighting device, which amber LED provides light of a warmer color temperature. When the normal LED light sources are set to maximum light output level, the amber LED light source is switched off. This may provide light of a correlated color temperature of for example 2700K. When dimming the lighting device, the light output level of the normal LED light sources will be decreased, and at the same time, the light output level of the amber LED light source will be increased. At a minimum light output level of the device, the normal LED light sources will be switched off, and the amber LED light source will be at a maximum light output level. The light may then have a correlated color temperature of approximately 2200K.

It is a disadvantage of the known LED-based lighting devices that in order to achieve the BBL dimming effect a relatively complicated controller is required for controlling the light output level of the normal LED light sources and that of the amber LED light source, as it has to be determined what the required output levels should be in order to achieve the BBL dimming effect. It is a further disadvantage of the known LED-based lighting devices that the light output of the amber LED light source shows a relative large decrease at increasing temperature of the LED, which is in particular disadvantageous in applications where light of a high brightness, e.g. spot light applications, is required. It is another further disadvantage of the known LED-based lighting devices that the CRI ("Color Rendering Index") of the generated light is relatively low at a color temperature of approximately 2200 K.

US2013/0093362A1) discloses a tunable light emitting device including a first set of LEDs, a second set of LEDs and a remote wavelength conversion component comprising two or more regions with different phosphors. The device further comprises a dimmer and a control circuit. The dimmer is configured to generate a continuous range of output powers to be used for the tunable light emitting device, and the control circuit is configured to translate the generated output power into an adjustable power arrangement for the LEDs.

US2010/0207521A1) discloses a light emitting apparatus including a plurality of LEDs on a substrate and a first phosphor layer covering the LEDs. On top of the phosphor layer a second phosphor material is provided in the form of dots. The second phosphor material allows performing fine color adjustments.

SUMMARY OF THE INVENTION

Hence, it is an aspect of the invention to provide a lighting device, which at least partly obviates the above-described drawbacks and which, during dimming of the lighting device, provides light with a correlated color temperature that substantially follows the BBL during at least a part of the range of the correlated color temperature achieved during dimming.

In a first aspect, the invention provides a lighting device comprising a first set of light emitting diodes arranged to emit light in a first blue wavelength range of 440 nm-465 nm, a second set of light emitting diodes arranged to emit light in a second blue wavelength range of 465 nm-490 nm, a first luminescent element radiationally coupled to the first and second set of light emitting diodes and arranged to convert at least a part of the light of the first wavelength range and at least a part of the light of the second wavelength range into first luminescent element light, a second luminescent element radiationally coupled to at least a subset of the second set of light emitting diodes and arranged to convert at least a part of the light of the second wavelength range into second luminescent element light, wherein, during operation, the brightness level of the light (i.e. the light output level) emitted by the first set of light emitting diodes and the brightness level of the light emitted by the second set of light emitting diodes, respectively, is controllable independently of each other and wherein the lighting device is arranged to generate white lighting device light. The light emitted by the first set of light emitting diodes and by the second set of light emitting diodes may be in the same subrange of the first wavelength range and the second wavelength range, respectively, for example both in the blue wavelength range. Alternatively, the subrange is different, for example the first set of light emitting diodes emits light in the blue wavelength range and the second set of light emitting diodes emits light in the violet wavelength range, during operation of the lighting device.

The term "white lighting device light" herein, is known to the person skilled in the art. It especially relates to light having a correlated color temperature (CCT) between about 2000 and 20000 K, especially 2700-20000 K, for general lighting especially in the range of about 2200 K and 6500 K, and for backlighting purposes especially in the range of about 7000 K and 20000 K, and within about 15 SDCM (standard deviation of color matching) from the BBL, especially within about 10 SDCM from the BBL, even more especially within about 5 SDCM from the BBL.

In an embodiment, the lighting device allows to provide light ("lighting device light") that maintains white, i.e. substantially on the BBL, during at least a part of a CCT range. "Substantially on the BBL" means within 15 SDCM ("Standard Deviation of Colour Matching") from the BBL during operation of the lighting device, even more especially within 10 SDCM, yet even more especially within 5 SDCM. In a specific embodiment, the first and second luminescent elements are configured to maintain the lighting device light white (especially within 15 SDCM, more especially within 10 SDCM, yet even more especially within 5 SDCM from the BBL) in a range of a CCT from 2100 K to 4500 K, even more especially in a range of a CCT from 2100 K to 3500 K, yet even more especially in a range of a CCT from 2100 K to 2700 K, yet even more especially in a range of a CCT from 2400 K to 2700 K.

The first and second luminescent elements are selected in such a way, that the CCT ("Correlated Color Temperature"), when dimming the lighting device, follows for at least part of a CCT range the BBL ("Black Body Locus"). The first luminescent element may be selected such that the correlated color temperature of the light that is generated by the first and second set of LEDs, when operating at full brightness, in combination with solely the first luminescent element provides light with a correlated color temperature substantially on the BBL. By applying a second luminescent element that is radiationally coupled to at least a subset of the second set of LEDs for converting at least a part of the light of the second wavelength range, the BBL dimming effect is achieved by simply dimming the first set of LEDs, i.e. by reducing the brightness level of the light generated by the first set of LEDs. No complicated control algorithms are required. The lighting device according to a first aspect of the invention comprises at least a first and a second luminescent element, of which the first luminescent element is radiationally coupled to the first and second set of LEDs, and the second luminescent element is at least radiationally coupled to one or more of the second set of LEDs and the first luminescent element.

It is noted that the published patent application US2010/0207521A discloses a LED device with a layer containing a first phosphor material covering the LED, and a second phosphor layer that is formed as a pattern on top of the layer with the first phosphor material. However, it is not disclosed that the LED device contains two sets of LEDs from which the brightness level is independently controllable and that the LED device allows have the BBL dimming effect when dimming the LED device.

The term "radiationally coupled" especially means that one or more LEDs and the luminescent element(s) are associated with each other so that at least part of the light emitted by the LED is received by the luminescent element(s) (and at least partly converted into luminescent light by said luminescent element(s)). Herein, a second luminescent element may also be radiationally coupled to a first luminescent element, which indicates that at least part of the emission of the first luminescent element is received by the second luminescent element (and may be at least partly converted into luminescent light by the second luminescent element).

The light emitting diode can be any light emitting diode, but is especially a light emitting diode that is able to substantially emit in the UV ("Ultra Violet"), violet or in the blue part of the light spectrum. Hence, in an embodiment the first and second set of light emitting diodes comprise blue light emitting LEDs. In yet another embodiment, which may be combined with the former embodiment, the light emitting diodes comprise UV light emitting LEDs. Preferably, the light emitting diodes emit at least light in a wavelength selected from the range of 300 nm-490 nm, especially 380 nm-490 nm. This light may partially be converted by the first and/or second luminescent element into light with a different wavelength range. The term "set of light emitting diodes" may relate to one light emitting diode or to a plurality of light emitting diodes, for example 2-20 LEDs.

In an embodiment, the first luminescent element comprises one or more luminescent materials from the group of a yellow light emitting luminescent material, a green light emitting luminescent material and a yellow/green light emitting luminescent material. In another embodiment, the second luminescent element comprises one or more luminescent materials from the group of a red light emitting luminescent material, an orange light emitting luminescent material and an orange/red light emitting luminescent material. In yet another embodiment, the first luminescent element comprises a further luminescent material from the group of a red light emitting luminescent material, an orange light emitting luminescent material and an orange/red light emitting luminescent material. The first luminescent element may for instance comprise a combination of green and red emitting luminescent materials, or a combination of yellow and red emitting luminescent materials, etc. In case of for example blue LEDs, during operation of the lighting device, the white lighting device light may be based on the combination of non-converted light generated by first and/or second set of blue light emitting diodes, the first luminescent element light and the second luminescent element light. In case light emitting diodes are applied that (predominantly) generate UV light, the first luminescent element comprises a combination of blue, green and red emitting luminescent materials, or alternatively a combination of blue, yellow and red emitting luminescent materials. During operation of the lighting device comprising a first set and a second set of UV LEDs, the white lighting device light may be based on the combination of the first luminescent element light and the second luminescent element light.

The terms "UV light" "UV emission" or "UV wavelength range" especially relates to light having a wavelength in the range of about 200 nm-420 nm. UV light may be subdivided into "UV-C light" that especially relates to light having a wavelength in the range of about 200 nm-280 nm, "UV-B light" that especially relates to light having a wavelength in the range of about 280 nm-315 nm and "UV-A light" that especially relates to light having a wavelength in the range of about 315 nm-420 nm. The terms "violet light", violet emission" or "violet wavelength range" especially relates to light having a wavelength in the range of about 380 nm-440 nm. The terms "blue light", "blue emission" or "blue wavelength range" especially relates to light having a wavelength in the range of about 440 nm-490 nm (including some violet and cyan hues). The terms "green light", "green emission" or "green wavelength range" especially relate to light having a wavelength in the range of about 490 nm-560 nm. The terms "yellow light", "yellow emission" or "yellow wavelength range" especially relate to light having a wavelength in the range of about 560 nm-590 nm. The terms "orange light", "orange emission" or "orange wavelength range" especially relate to light having a wavelength in the range of about 590 nm-620 nm. The terms "red light", "red emission" or "red wavelength range" especially relate to light having a wavelength in the range of about 620 nm-750 nm, especially 620 nm-650 nm. The terms "visible", "visible light", "visible emission" or "visible wavelength range" refer to light having a wavelength in the range of about 380 nm-750 nm.

The first and/or second luminescent element(s) may comprise one or more inorganic luminescent materials. In a further embodiment, the inorganic luminescent materials are selected from the group consisting of divalent europium containing nitride luminescent material, a divalent europium containing oxynitride luminescent material, a divalent europium containing sulfide luminescent material, and a divalent europium containing selenide (and sulfide) luminescent material. A red luminescent material may in an embodiment comprise one or more materials selected from the group consisting of (Ba,Sr,Ca)S:Eu, Ca(S,Se):Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M i.e. one or more of Ba, Sr, and Ca). Likewise, the material (Ba,Sr,Ca)AlSiN$_3$:Eu can also be indicated as MAlSiN3:Eu wherein M is one or more elements selected from the group consisting of barium (Ba) strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the inorganic luminescent material comprises (Ca,Sr,Ba)AlSiN$_3$:Eu, preferably CaAlSiN$_3$:Eu. Further, in another embodiment, which may be combined with the former, the inorganic luminescent material comprises (Ca,Sr,Ba)$_2$Si$_5$N$_8$:Eu, preferably (Sr,Ba)$_2$Si$_5$N$_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc. Similar principles relate to the term "(S,Se)".

In a further embodiment, the first and/or second luminescent element(s) may comprise one or more inorganic luminescent materials selected from the group consisting of a trivalent cerium containing garnet, a trivalent cerium containing oxynitride, and a trivalent cerium containing nitride. Especially, the luminescent material may further comprise a M$_3$A$_5$O$_{12}$:Ce$^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the first luminescent element comprises at least two luminescent materials of the type of M$_3$A$_5$O$_{12}$:Ce$^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as Y$_3$Al$_5$O$_{12}$:Ce$^{3+}$, and one of them may be a Y,Lu based system, such as (Y$_{0.5}$Lu$_{0.5}$)$_3$Al$_5$O$_{12}$:Ce$^{3+}$. Embodiments of garnets especially include M$_3$A$_5$O$_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises (Y$_{1-x}$Lu$_x$)$_3$B$_5$O$_2$:Ce, wherein x is equal to or larger than 0 and equal to or smaller than 1. The term ":Ce" or ":Ce$^{3+}$", indicates that part of the metal ions (i.e. in the garnets: part of the "M" ions) in the luminescent material is replaced by Ce. For instance, assuming (Y$_{1-x}$Lu$_x$)$_3$Al$_5$O$_{12}$:Ce, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be (Y$_{0.1}$Lu$_{0.89}$Ce$_{0.01}$)$_3$Al$_5$O$_{12}$. Ce in garnets is substantially or only in the trivalent state, as known to the person skilled in the art.

In another further embodiment, the first and/or second luminescent element(s) may comprise at one or more organic luminescent materials. There is a nearly unlimited assortment of such organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Organic luminescent materials of special interest that may be applied comprise for instance BASF Lumogen 850 for green luminescence, BASF Lumogen F083 or F170 for yellow luminescence, BASF Lumogen F 240 for orange luminescence, and BASF Lumogen F 300 or F305 for red luminescence. Hence, the first and/or second luminescent element(s) may comprise for instance at least two of the above-mentioned organic luminescent materials, and optionally one or more further organic luminescent materials, which may also be selected from the above-mentioned organic luminescent materials.

The luminescent material(s) of the first and/or the second luminescent element(s) may be embedded in a material transmissive for visible light and/or UV light, such as a transmissive film or plate. The transmissive material may be used for encapsulation of the first and second set of LEDs, and for protection of the electrical wires on the board, for example. In addition, the transmissive material may be used as a matrix material for the second luminescent element. Especially, transmissive organic materials may be applied, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethyleneterephthalate (PET), (PETG) (glycol modified polyethyleneterephthalate), PDMS (polydimethylsiloxane), and COC (cyclo olefin copolymer). A flexible transmissive material, for example silicone, is preferred in lighting devices that may become relatively hot during operation, e.g. for high brightness applications, as these devices have a relatively high mechanical stress.

The second luminescent element may comprise a plurality of discrete luminescent elements, wherein each discrete luminescent element is radiationally coupled to a respective LED from the second set of LEDs. Alternatively, only a subset of the second set of LEDs is radiationally coupled to a respective discrete luminescent element (and the other LEDs of the second set of LEDs are not radiationally coupled to a discrete luminescent element). The discrete luminescent elements may for example be solid particles, patches, dots, grains or the like, or optionally hardened droplets of a polymer composition (which may be applied in a liquid or semi-liquid state). A discrete luminescent element typically comprises a luminescent material which is dissolved or dispersed in a polymeric matrix. The polymeric matrix is typically transparent or at least translucent with respect to light of the wavelengths received (converted) and emitted by the luminescent material. Optionally, the discrete luminescent elements may contain an adhesive, typically a binder, which may serve to attach the luminescent elements to the support. The discrete luminescent elements may be arranged on a surface of the layer that forms the first luminescent element, or alternatively, partly embedded in said layer and partly protruding from said layer.

The first set of light emitting diodes is arranged to emit blue light in the wavelength range of 440 nm-465 nm, and the second set of light emitting diodes is arranged to emit blue light in the wavelength range of 465 nm-490 nm. An advantage of this embodiment is that the absorption of blue light, generated by the second set of LEDs, by the first luminescent element may be reduced so that more of such blue light may be converted by the second luminescent element. Furthermore, by using blue light with a relatively longer wavelength, the CRI of the lighting device light may be improved.

In an embodiment of the lighting device, the first set of light emitting diodes is arranged to emit blue light in the wavelength range of 440 nm-465 nm, and wherein the second set of light emitting diodes is arranged to emit violet light in the wavelength range of 400 nm-440 nm. An advantage of this embodiment is that by using violet light with a relatively small wavelength, white objects (e.g. paper or fabrics) are perceived as more white by a human being compared to a lighting device only using blue light emitting LEDs.

It is relatively difficult to obtain the BBL dimming effect for a lighting device with a first and a second set of light emitting diodes that are independently controllable and which comprises a mixture of two luminescent materials (for example a yellow light emitting and a red light emitting luminescent material) that are homogeneously mixed and covering both the first and second set of LEDs (for example in a single layer). For such a lighting device, the CCT of the light obtained with each of the two sets of LEDs individually has to be controlled very accurately, otherwise the lighting device will produce light that will be perceived as tinted light instead of white light when dimming the lighting device. With a lighting device according to the invention with the second luminescent element being radiationally coupled to at least a subset of the LEDs of the second set of LEDs, the BBL dimming effect can be achieved in a relatively simple manner. The first luminescent element and the second luminescent element are selected such that the correlated color temperature of the lighting device light that is generated by the first and second set of LEDs, operating at full brightness, in combination with the first luminescent element and the second luminescent element is substantially on the BBL. The second luminescent element is aligned with (at least a subset of) the LEDs from the second set of LEDs and provided, for example, downstream with respect to the first luminescent element. The correlated color temperature of the light that can be reached when dimming the lighting device may be determined by the thickness of the second luminescent element, the luminescent materials that are used for the second luminescent element and the number of LEDs from the second set of LEDs that will be radiationally coupled to the second luminescent element. By using, for example, a printing technique to deposit particles of the second luminescent element on the first luminescent element, relatively small particles can be made that may be distributed homogeneously on the first luminescent element, resulting in an improved color mixing of the light provided by the lighting device during operation. Furthermore, no barriers between the LEDs of the first set of LEDs and the second set of LEDs have to be provided, allowing a more closely spacing of the LEDs, which is beneficial for applications where a relatively high brightness of the light is required, e.g. spot light applications or automotive lighting applications. The particles of the second luminescent element may be distributed such that each LED of the second set of LEDs is aligned (and hence radiationally coupled to) with such a particle, or that only a part of the LEDs of the second set of LEDs is aligned with a particle of the second luminescent element. The choice for the specific luminescent material(s) that is (are) used for the first luminescent element and/or the second luminescent elements may also be used to control the range for the CRI ("Color Rendering Index") and/or the range of the CCT ("Correlated Color Temperature") of the lighting device light that can be achieved when dimming the lighting device.

The terms "upstream" and "downstream" relate to an arrangement of items or features relative to the propagation of the light from a light generating means (here especially the light source), wherein relative to a first position within a beam of light from the light generating means, a second position in the beam of light closer to the light generating means is "upstream", and a third position within the beam of light further away from the light generating means is "downstream".

In an embodiment of the lighting device, the first and/or second luminescent element(s) may comprise quantum dots. Herein, quantum dots refer to luminescent quantum dots, i.e. those that can be excited by UV and/or blue light, and emit at least somewhere in the visible wavelength range of the spectrum.

In a second aspect, the invention provides a lighting module comprising a lighting device according to a first aspect of the invention.

In a third aspect, the invention provides a lamp comprising a lighting module according to a first aspect of the invention.

In a fourth aspect, the invention provides a luminaire comprising a lighting device according to a first aspect of the invention, or a lighting module according to a second aspect of the invention.

An advantage of such a lighting module, lamp or luminaire is that it allows to have a dimmable lighting apparatus that has the BBL dimming effect.

In a fifth aspect, the invention provides method for producing a lighting device, the method comprising the steps: arranging a first set of light emitting diodes adapted to emit light in a first blue wavelength range of 440 nm-465 nm on a board, arranging a second set of light emitting diodes adapted to emit light in a second blue wavelength range of 465 nm-490 nm on the board wherein the second set of light emitting diodes are arranged to be controllable independently of the first set of light emitting diodes, depositing a first luminescent layer on the first and second set of light emitting diodes thereby providing a first luminescent element, wherein the layer comprises at least one luminescent material for converting at least a part of the light of the first wavelength range and at least a part of the light of the second wavelength range into first luminescent element light, depositing a plurality of discrete luminescent elements on the layer thereby providing a second luminescent element, the discrete luminescent elements comprising a matrix material in which at least one luminescent material is distributed, the discrete luminescent elements being radiationally coupled to at least a subset of the second set of light emitting diodes and arranged to convert at least a part of the light of the second wavelength range into second luminescent element light. This method allows to deposit the second luminescent element as relatively small phosphor particles on top of the encapsulation layer, resulting in a relatively good color mixing of the light produced by the lighting device.

Furthermore, no additional barriers between the LEDs of the first and second set of LEDs are required, allowing a more close spacing of the LEDs which is desirable for spot light applications, for example.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

These drawings are not necessarily on scale.

DETAILED DESCRIPTION OF THE EMBODIMENTS

Figure 1A:
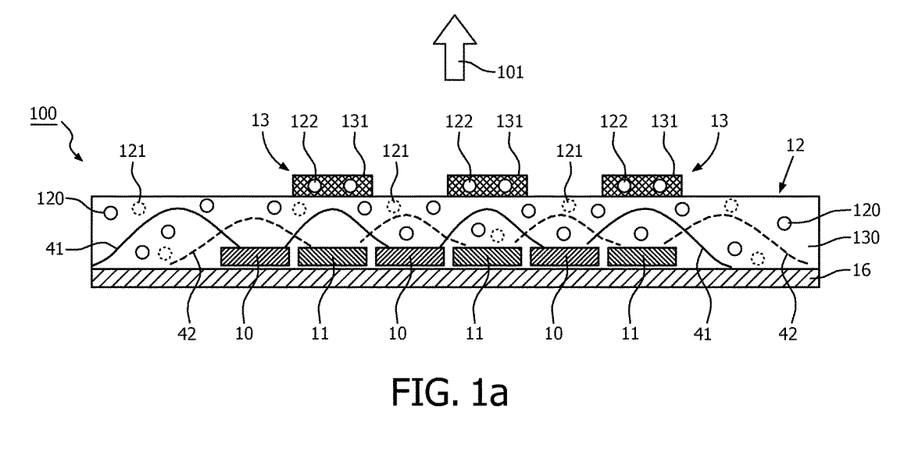
FIGS. 1a and 1b schematically depict a first embodiment of the lighting device according to a first aspect of the invention.
Figure 1B:
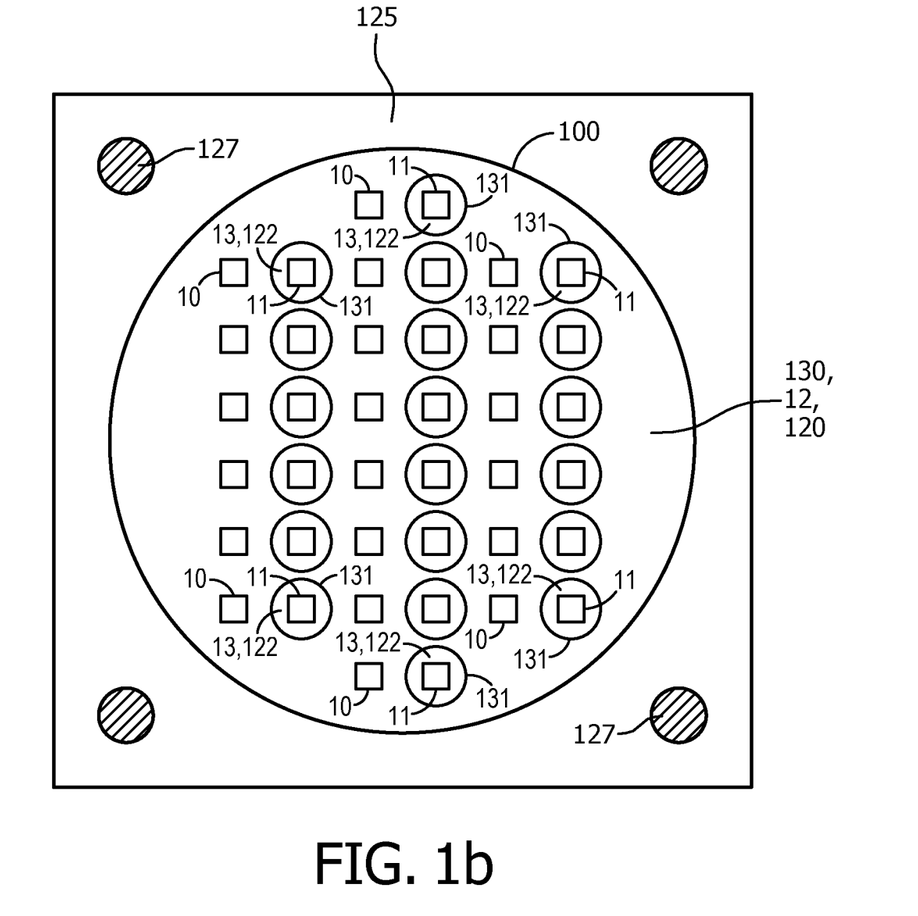

FIGS. 1*a* and 1*b* schematically depict a lighting device 100 comprising a first set of LEDs 10, a second set of LEDs 11, and first and second luminescent elements 12, 13. The first and second set of LEDs 10, 11 are mounted on a board 16. The first set of LEDs 10 is configured to generate blue light 14 (FIG. 1*a*) in the wavelength range 440 nm-490 nm during operation of the lighting device 100. The second set of LEDs is configured to generate blue light 15 (FIG. 1*a*) in the wavelength range 440 nm-490 nm during operation of the lighting device 100. In an alternative embodiment, the blue light 14 is in the wavelength range of 440-465 nm and the blue light 15 is in the wavelength range of 465 nm-490 nm. In another alternative embodiment of the lighting device, the first set of light emitting diodes is arranged to emit blue light in the wavelength range of 440 nm-465 nm, and wherein the second set of light emitting diodes is arranged to emit violet light in the wavelength range of 400 nm-440 nm. The blue light 14, 15 is used as excitation light by the first luminescent element 12 that is radiationally coupled to the first and the second set of blue LEDs 10, 11. The light 15 is used as excitation light by the second luminescent element 13 that is radiationally coupled to the second set of LEDs 11. The first luminescent element 12 comprises an inorganic luminescent material 120, for example a yellow/green light emitting luminescent material, configured in a layer 130 that comprises a polymer material for embedding the luminescent material 120. The layer 130 may in addition be used for encapsulation of the first and second set of LEDs 10, 11 for protection against the influence of moisture and air that may cause degradation of the LEDs. In an alternative embodiment, the luminescent element 12 further comprises a second inorganic luminescent material 121 (FIG. 1*a*), for example a red emitting luminescent material. The luminescent materials 120, 121 may be mixed in one layer 130, or alternatively embedded in two separate layers on top of each other (not shown in FIG. 1*a*). The second luminescent element 13 comprises an inorganic luminescent material 122, for example a red emitting luminescent material, configured in a one or more discrete luminescent elements in the form of particles 131 that comprise a polymer material for embedding the luminescent material 122. The particles 131 are positioned on the layer 130, i.e. downstream from the second set of LEDs when compared to the first luminescent element 12, such that the luminescent element 13 is mainly excited by the light 15 during operation of the lighting device 100. The particles may 131 may be deposited on top of the first luminescent element 12 by means of a printing technique and may have different shapes, for example a round, oval, square, rectangular or elongated shape. The particles 131 may be provided as a liquid composition comprising luminescent material and a soluble binder in an organic solvent, and the composition may be printed onto the surface of the support. After printing, the solvent may evaporate to leave particles, as discrete luminescent elements, covered with a layer of binder. Preferably, the position of the particles 131 is aligned with the position of the corresponding LEDs of the second set of LEDs 11. The surface area of the particles 131 matches the surface area of the LEDs of the second set of LEDs 11. In an alternative embodiment, the surface area of the particles 131 is larger than the surface area of the LEDs, for example up to two times or up to three times as large. In an alternative embodiment, the first luminescent element 12 may comprise one or more organic luminescent materials embedded in a layer 130, or one or more quantum dot materials embedded in the layer 130. In another alternative embodiment, the second luminescent element 13 may comprise an organic luminescent material or a quantum dot material embedded in a particle 131. The LEDs of the first set of LEDs 10 are connected via first wire bonds 41 (FIG. 1*a*) to form a first string of LEDs, and the LEDs of the second set of LEDs 11 are connected via second wire bonds 42 (FIG. 1*a*) to form a second string of LEDs. The wire bond design allows to power and control the first set of LEDs 10 independently from the second set of LEDs 11. The lighting device 100 is configured to generate white lighting device light 101 (FIG. 1*a*) during operation (of the lighting device) and the correlated color temperature of the white lighting device light 101 changes when dimming the first set of LEDs 10 while substantially following the BBL for at least a range of the resulting CCT. The lighting device 100 may have a single control button (not shown in FIG. 1*a,b*) and by pressing or turning this button the relative brightness levels of the first and second set of LEDs 10,11 are changed for dimming (i.e. reducing the light output level of) the lighting device 100. In an alternative embodiment, only a subset of the LEDs from the second set of LEDs 11 is covered by a particle 131 comprising luminescent material 13, for example, half of the LEDs of the second set of LEDs 11 is covered by a particle 131. Preferably, the particles 131 are distributed homogeneously on the first luminescent element 12. In an alternative embodiment, the particles 131 are distributed non-homogeneously on the first luminescent element 12. The board 16 (FIG. 2*a*) may be any material on which the first and second set of LEDs 10, 11 are mounted. In an alternative embodiment, the first and second set of LEDs 10, 11 are mounted on a substrate 125 (FIG. 1*b*) which is, for example, a metal core printed circuit board or a ceramic substrate. The substrate 125 comprises pads 127 for providing electrical power to the lighting device 100. Only a part of the substrate 125 that comprises the first and second set of LEDs 10, 11 is covered by the first luminescent element. Such a lighting device may be referred to as a COB ("Chip On Board") module. In an alternative embodiment, the first and second set of LEDs are arranged in a different pattern on the board 16, for example in a checkerboard pattern.

Figure 2A:
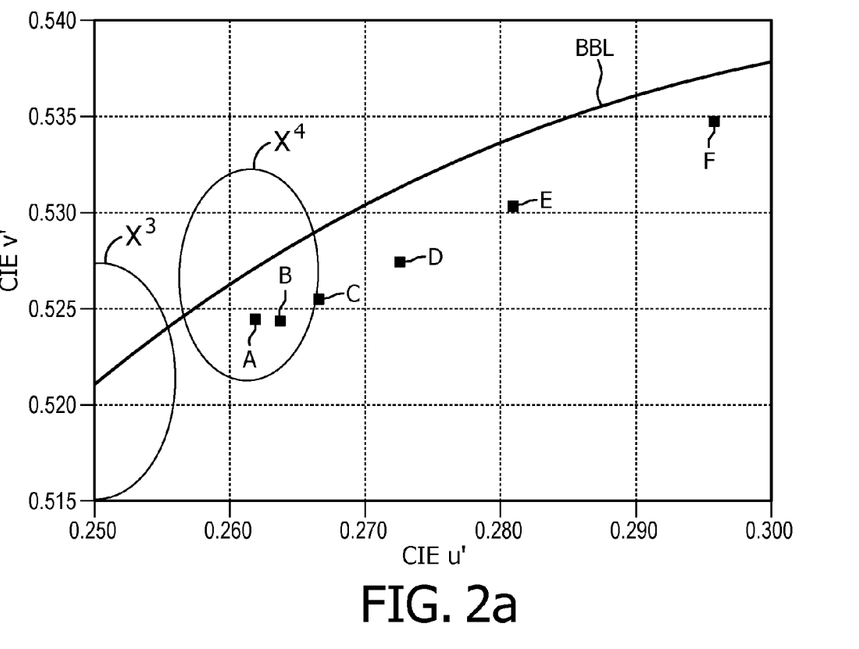
FIGS. 2a-2d depict experimental results.

FIGS. 2*a*-2*d* depict experimental results. FIG. 2*a* shows the shift of the correlated color temperature of the lighting device light 101 as produced, during operation, by a lighting device 100 according to an embodiment as shown in FIG. 1*a,b*, with a first string of nine blue light emitting LEDs as the first set of LEDs 10, a second string of nine blue light emitting LEDs as the second set of LEDs 11. The 18 LEDs (each 1 mm$^2$) are positioned on a round board (diameter 10 mm) and the first luminescent element 12 comprises a combination of a green/yellow emitting YAG:Ce phosphor (85 wt. %) and a red remitting CaAlSiN$_3$:Eu phosphor (15 wt. %) in a silicone layer. The second luminescent element 13 comprises a red emitting CaAlSiN$_3$:Eu phosphor in a silicone matrix material. The second luminescent element 13 is applied as nine particles 131 on the first luminescent element 12. The position of these particles 131 is aligned with the position of the nine LEDs from the second string of LEDs, i.e. a respective particle 131 is positioned on top of the first luminescent element 12 and radiationally coupled to a respective LED (from the second set) at the shortest distance. The size of the particles 131 is about 1 mm². In an alternative embodiment, the particles 131 have a different size in the range of 1-3 mm², or in the range of 1-2 mm². In case both the first and second string of LEDs 10, 11 are driven to their maximal current, the correlated color temperature of the lighting device light 101 is approximately 2700 K (CRI amounts to 88), indicated by reference A in FIG. 2a. In case only the second string of LEDs is powered, the CCT of the lighting device light is approximately 2100 K (CRI amounts to 87), indicated by reference F in FIG. 2a. Starting in FIG. 2a with a lighting device where both strings of LEDs are driven to their maximal current (reference A) and subsequently dimming (i.e. decreasing the brightness level) of the first string of LEDs, the resulting CCT of the lighting device light will decrease (as indicated by references B, C, D and E, respectively) and finally when the first string of LEDs is completely dimmed, a CCT of approximately 2100 K (reference F) is reached. The references $X^3$ and $X^4$ indicate a range of 5 SDCM from the BBL for a CCT of 3000 K and 2725 K, respectively. As can be seen from FIG. 2a, during dimming of the first string of LEDs the resulting CCT of the lighting device light 101 will substantially follow the Black Body Locus ("BBL"). Hence the lighting device light 101 is perceived as white light during dimming of the lighting device and by adjusting the current supply to the first string of LEDs and the second string of LEDs any correlated color temperature between 2100 K and 2700 K can be generated while maintaining substantially on the BBL, with a CRI that is above the value of 80.

Figure 2B:
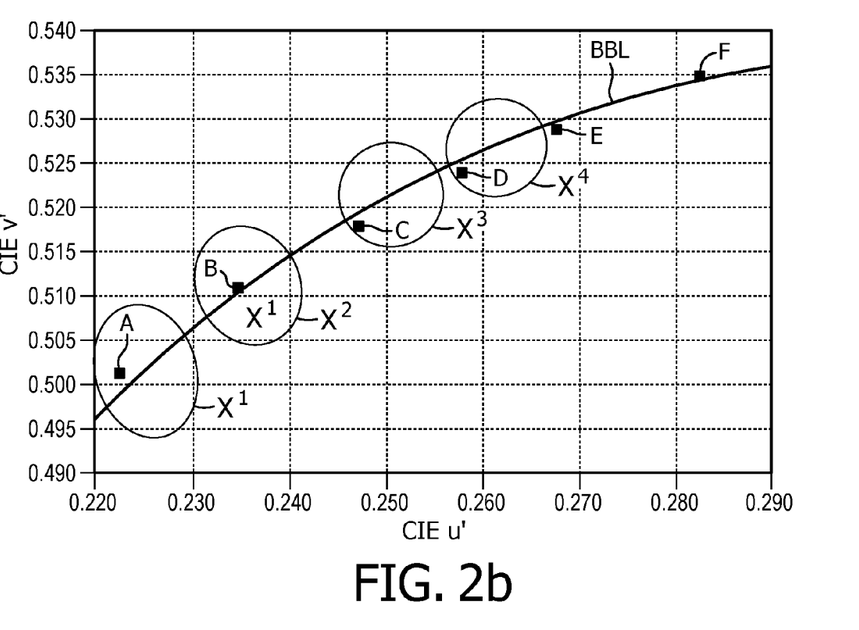

FIG. 2b shows the shift of the correlated color temperature of the lighting device light 101 as produced, during operation, by a lighting device 100 according to an embodiment as shown in FIG. 1a,b, with a with a first string of nine blue light emitting LEDs as the first set of LEDs 10, a second string of nine blue light emitting LEDs as the second set of LEDs 11. The 18 LEDs (each 1 mm²) are positioned on a round board (diameter 10 mm) and the first luminescent element 12 comprises a combination of a green/yellow emitting YAG:Ce phosphor (85 wt. %) and a red emitting CaAlSiN$_3$:Eu phosphor (15 wt. %) in a silicone layer. The luminescent element 13 comprises an orange/red emitting (Sr,Ca)AlSiN$_3$:Eu phosphor in a silicone matrix material, and that is applied as nine particles 131 on the first luminescent element 12. The position of the particles 131 is aligned with the position of the nine LEDs from the second string of LEDs. The size of the particles 131 is about 1 mm². In an alternative embodiment, the particles 131 have a different size in the range of 1-3 mm², or in the range of 1-2 mm². In case both the first and second string of LEDs 10, 11 are driven to their maximal current, the correlated color temperature of the lighting device light 101 is approximately 4000 K (CRI amounts to 87), indicated by reference A in FIG. 2b. In case only the second string of LEDs is powered, the CCT of the lighting device light is approximately 2350 K (CRI amounts to 77), indicated by reference F in FIG. 2b. Starting in FIG. 2b with a lighting device where both strings of LEDs are driven to their maximal current (reference A) and subsequently dimming (i.e. decreasing the brightness level) of the first string of LEDs, the resulting CCT of the lighting device light will decrease (as indicated by reference B, C, D and E, respectively) and finally when the first string of LEDs is completely dimmed, a CCT of approximately 2350 K (reference F) is reached. The references $X^1$, $X^2$, $X^3$ and $X^4$ indicate a range of 5 SDCM from the BBL for a CCT of 4000 K, 3500 K, 3000 K and 2725 K, respectively. As can be seen from FIG. 2b, during dimming of the first string of LEDs the resulting CCT of the lighting device light 101 will substantially follow the Black Body Locus ("BBL"). Hence the lighting device light 101 is perceived as white light during dimming of the lighting device and by adjusting the current supply to the first string of LEDs and the second string of LEDs any correlated color temperature between 2350 K and 4000 K can be generated while maintaining substantially on the BBL, including light with a CRI that is around 80 (resulting in a higher light output compared to the embodiment related to FIG. 2a). By mixing a red emitting CaAlSiN$_3$:Eu phosphor (as used in an embodiment of the lighting device related to FIG. 2a) with an orange/red emitting (Sr, Ca)AlSiN$_3$:Eu phosphor (as used in the embodiment of the lighting device related to FIG. 2b) in the luminescent element 13, the CRI of the lighting device light can be tuned to the desired level.

Figure 2C:
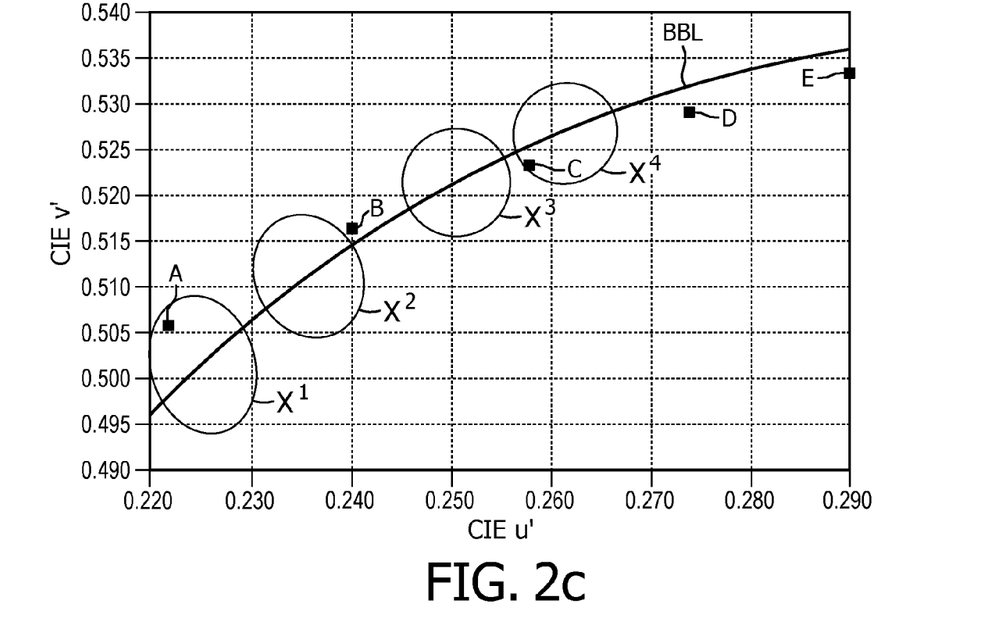

FIG. 2c shows the shift of the correlated color temperature of the lighting device light 101 as produced, during operation, by a lighting device 100 according to an embodiment as shown in FIG. 1a,b, with a with a first string of nine blue light emitting LEDs as the first set of LEDs 10, a second string of nine blue light emitting LEDs as the second set of LEDs 11. The 18 LEDs (each 1 mm²) are positioned on a round board (diameter 10 mm) and the first luminescent element 12 comprises a combination of a green/yellow emitting YAG:Ce phosphor, a red emitting CaAlSiN$_3$:Eu phosphor and an orange/red emitting (Sr, Ca)AlSiN$_3$:Eu phosphor in a silicone layer. The luminescent element 13 comprises a red emitting CaAlSiN$_3$:Eu phosphor in a silicone matrix material, and that is applied as nine particles 131 on the first luminescent element 12. The position of the particles 131 is aligned with the position of the nine LEDs from the second string of LEDs 11. The size of the particles 131 is about 1 mm². In an alternative embodiment, the particles 131 have a different size in the range of 1-3 mm², or in the range of 1-2 mm². In case both the first and second strings of LEDs are driven to their maximal current, the correlated color temperature of the lighting device light is approximately 4000 K (CRI amounts to 90), indicated by reference A in FIG. 2c. In case only the second string of LEDs is powered, the CCT of the lighting device light is approximately 2200 K (CRI amounts to 94), indicated by reference F in FIG. 2c.

Starting in FIG. 2c with a lighting device where both strings are driven to their maximal current (reference A) and subsequently dimming (i.e. decreasing the brightness level) of the first string of LEDs, the resulting CCT of the lighting device light will decrease (as indicated by reference B, C and D, respectively) and finally when the first string of LEDs is completely dimmed, a CCT of approximately 2200 K (reference E) is reached. The references $X^1$, $X^2$, $X^3$ and $X^4$ indicate a range of 5 SDCM from the BBL for a CCT of 4000 K, 3500 K, 3000 K and 2725 K, respectively. As can be seen from FIG. 2c, during dimming of the first string of LEDs the resulting CCT of the lighting device light 101 will substantially follow the Black Body Locus ("BBL"). Hence the lighting device light 101 is perceived as white light during dimming of the lighting device and by adjusting the current supply to the first string of LEDs and the second string of LEDs any correlated color temperature between 2200 K and 4000 K can be generated while maintaining substantially on the BBL, with a CRI that is 90 or higher.

Figure 2D:
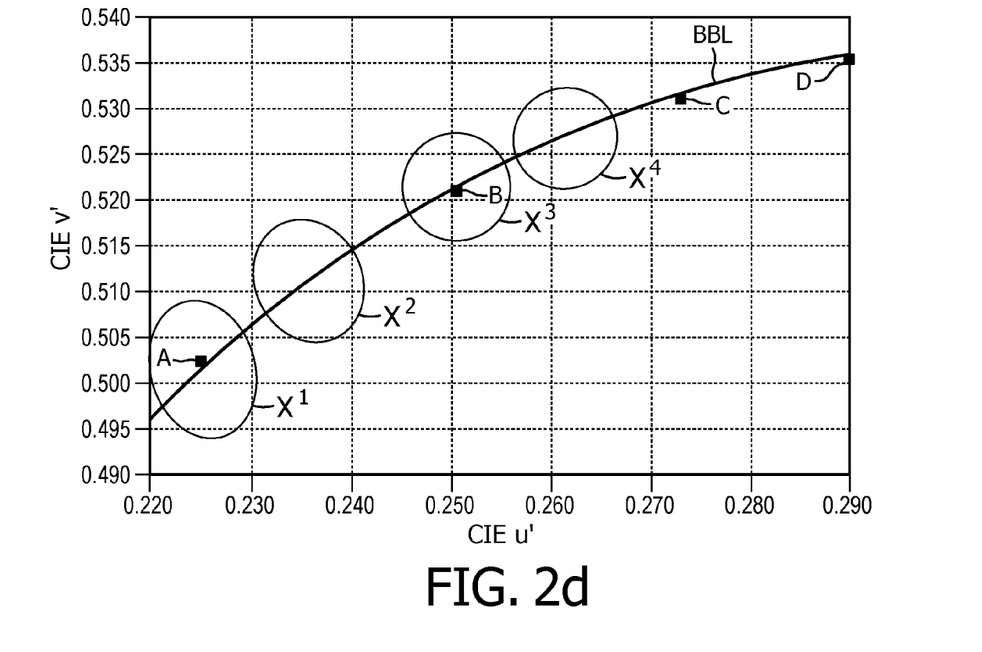

FIG. 2d shows the shift of the correlated color temperature of lighting device light as produced, during operation, by a lighting device with a first string of blue LEDs, a second string of blue LEDs and a third string of blue LEDs. A first luminescent element is deposited on the three strings of LEDs and comprising a green emitting LuAG:Ce phosphor that is mixed in a silicone layer. A second luminescent element comprises a green emitting LuAG:Ce phosphor that is mixed in a silicone material and that is applied as particles on the first luminescent element and aligned with the LEDs from the second string of LEDs. A third luminescent element comprises a red emitting $CaAlSiN_3$:Eu phosphor in a silicone matrix material and that is applied as particles on the first luminescent element and aligned with the LEDs from the third string of LEDs. In case all three strings of LEDs are drive to their maximal current, the Correlated Color Temperature (CCT) of the lighting device light is approximately 4000 K (CRI amounts to 86), indicated by reference A in FIG. 2d. In case only the third string of LEDs is powered, the CCT of the lighting device light is approximately 2200 K (CRI amounts to 79), indicated by reference D in FIG. 2d. Starting in FIG. 2d with a lighting device where both strings are driven to their maximal current (reference A) and subsequently dimming (i.e. decreasing the brightness level) of the first and second string of LEDs, the resulting CCT of the lighting device light will decrease (as indicated by reference B and C, respectively) and finally when completely dimming the first string of LEDs a CCT of approximately 2200 K (reference D) is reached. The references $X^1$, $X^2$, $X^3$ and $X^4$ indicate a range of 5 SDCM from the BBL for a CCT of 4000 K, 3500 K, 3000 K and 2725 K, respectively. As can be seen from FIG. 2d, during dimming of the first and second string of LEDs the resulting CCT of the lighting device light will substantially follow the Black Body Locus ("BBL"). Hence the lighting device light is perceived as white light during dimming of the lighting device and by adjusting the current supply to the first string of LEDs and the second string of LEDs any color point between 2200 K and 4000 K can be generated while maintaining substantially on the BBL, with a CRI that is 79 or higher. By applying alternative luminescent material(s) in the second luminescent element 13, the CRI may be tuned to a higher range.

Figure 3:
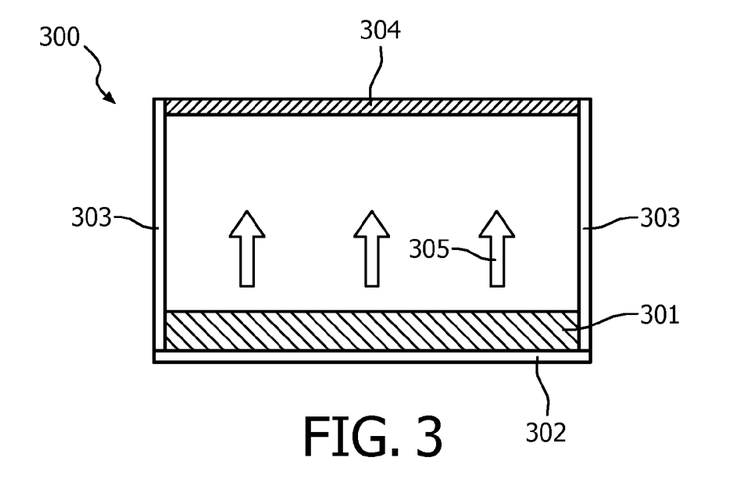
FIG. 3 schematically depicts a lighting module according to a second aspect of the invention.

FIG. 3 schematically shows a lighting module 300 comprising a lighting device 301 according to the invention. The lighting device 301 is mounted on a surface 302 of the module 300. The module 300 comprises a reflective side wall 303 and a light exit window 304. During operation of the module 300, the lighting device light 305 produced by the lighting device 301 exits the module via the light exit window 304. The module 300 can have any shape, e.g. a cylindrical shape, a rectangular shape etc.

Figure 4A:
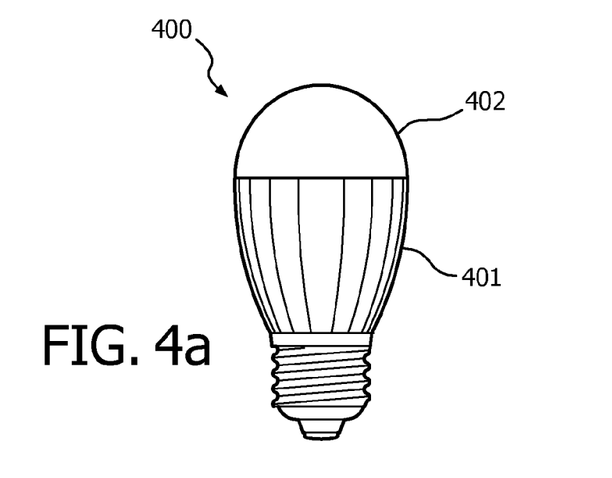
FIGS. 4a and 4b schematically depict a lamp according to a third aspect of the invention.

FIG. 4a schematically shows a lamp, intended for replacement of a conventional incandescent bulb. The lamp 400 is an LED based lamp provided with a base 401 adapted for a conventional bulb socket, and a bulb-shaped or dome-shaped transparent cover member 402. A lighting device according to a first aspect of the invention is arranged on the flat, upper surface (not shown in FIG. 4a) of the base and is thus covered by the translucent cover member through which the lighting device light exits during operation of the lamp 400. The base 400 comprises the electrical components for controlling the lighting device and may additionally act as a heat sink.

Figure 4B:
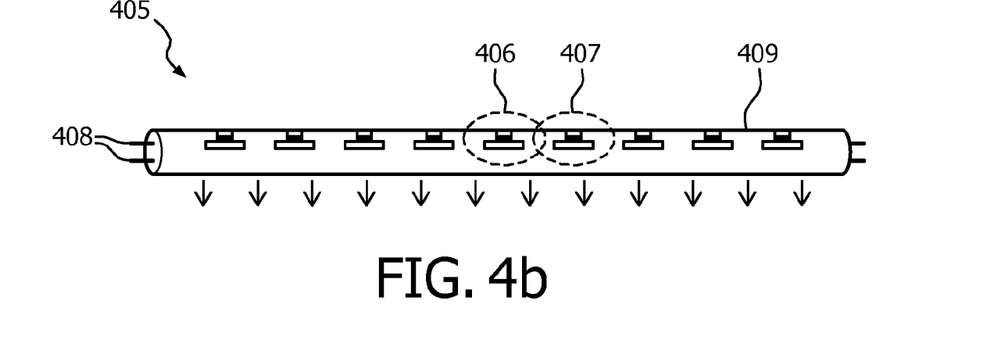

FIG. 4b schematically shows a lamp, intended for replacement of a conventional fluorescent tube. The lamp 405 comprises an elongated tube 409. The tube 409 comprises, in a lateral direction, a plurality of lighting devices 406, 407 according to a first aspect of the invention. In an alternative embodiment, the lamp 405 comprises one elongated lighting device according a first aspect of the invention, instead of a plurality of lighting devices 406, 407. The lighting devices 406, 407 are controlled via pins 408 that, during operation of the lamp 405, are connected to a driver (not shown in FIG. 4b). The lighting device light generated by the lighting devices 406, 407 exits the lamp 405 via the tube 409.

Figure 5A:
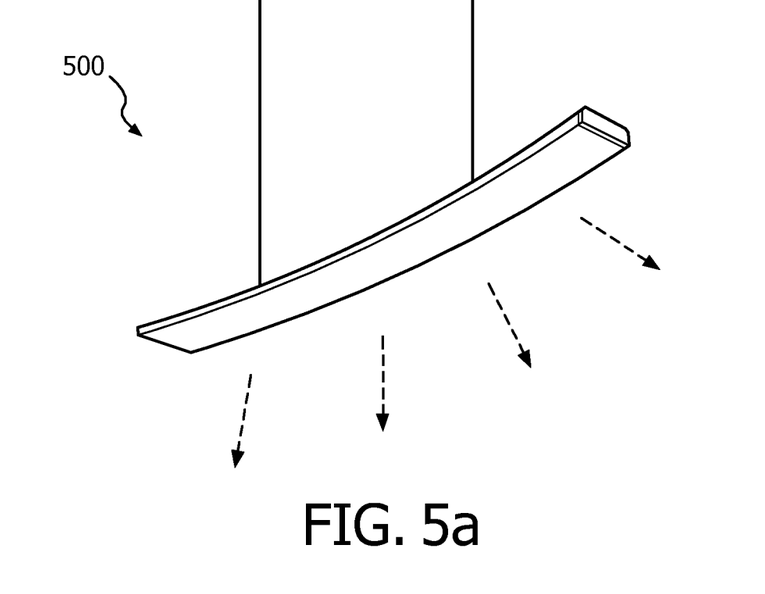
FIGS. 5a and 5b schematically depict a luminaire according to a fourth aspect of the invention.

FIG. 5a schematically shows a luminaire 500 according to a fourth aspect of the invention. The luminaire comprises one or more lighting devices according to the first aspect of the invention, or comprises one or more modules according to a second aspect of the invention, or comprises one or more lamps according to a third aspect of the invention.

Figure 5B:
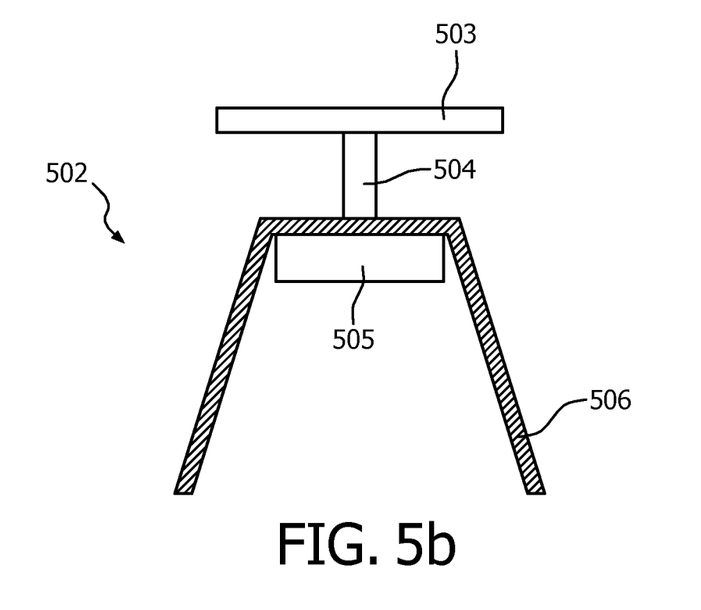

FIG. 5b schematically shows a luminaire 502, intended for the generating a beam of light with a relatively high brightness. The luminaire 502 may be mounted to a ceiling or a wall of a structure via a plate 503. A lighting device 505 according to a first aspect of the invention is mounted in a reflector 506 that is connected to the plate 503 via a connector 504. Inside the connector 504 electric wires are positioned for connecting the lighting device 505 to a power supply (not shown in FIG. 5b). The light generated by the lighting device 505 that not directly exits the luminaire 502, during operation, is reflected by the reflector 506 resulting in a beam of light of a relatively high brightness. In an alternative embodiment, a module 505 according to a second aspect of the invention is mounted in the reflector 506. The module 505 may have additional optics for beam shaping in or at its light exit window.

Figure 6:
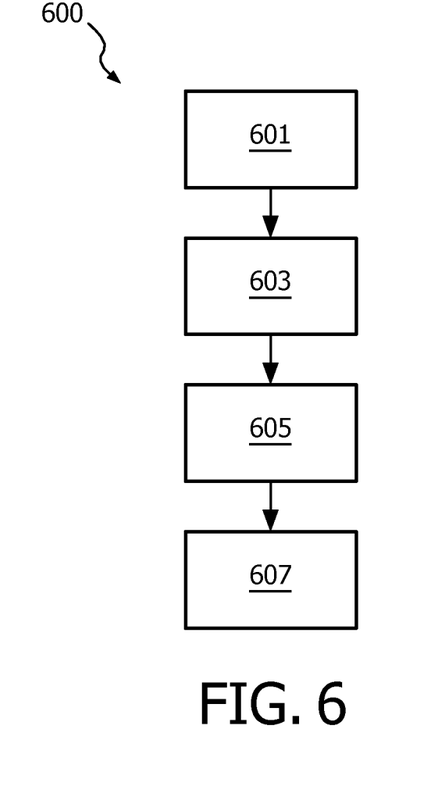
FIG. 6 schematically depicts a method for producing a lighting device according to a fifth aspect of the invention.

FIG. 6 shows a method 600 for producing a lighting device according to the invention. In a first step 601, a first set of light emitting diodes 10 adapted to emit light 14 in a first wavelength range of 300 nm-490 nm is arranged on a board 16. In a second step 603, a second set of light emitting diodes 11 adapted to emit light (15) in a second wavelength range of 300 nm-490 nm and that is controllable independently of the first set of light emitting diodes is arranged on the board 16. In a third step 605, a first luminescent element 12 is deposited on the first and second set of light emitting diodes 10, 11 as a layer 130, wherein the layer 130 comprises a luminescent material 120 for converting at least a part of the light of the first wavelength range and at least a part of the light of the second wavelength range into first luminescent element light. Optionally, the layer 130 may comprise two or more luminescent materials 120, 121. Optionally, the two or more luminescent materials 120, 121 may be applied in two separate layers on top of each other (not shown in FIG. 6). In a fourth step 607, a second luminescent element 13 is deposited on the layer 130 by means of a printing technique as particles 131 of a matrix material comprising a luminescent material 122, the second luminescent element being radiationally coupled to at least a subset of the LEDs from the second set of light emitting diodes 11 and arranged to convert at least a part of the light 15 of the second wavelength range into second luminescent material light. The first luminescent element and the second luminescent element are selected such that the correlated color temperature of the lighting device light that is generated by the first and second set of LEDs, operating at full brightness, in combination with the first luminescent element and the second luminescent element is substantially on the BBL. In another embodiment, the first luminescent element may comprise one or more inorganic luminescent materials, for example a green/yellow emitting luminescent material and optionally a red emitting luminescent material. In another embodiment, the second luminescent element may comprise one or more inorganic luminescent materials, e.g. a red emitting luminescent material. In another embodiment, the particles 131 of the second luminescent element 13 may be distributed on the layer 130 such that each LED of the second set of LEDs is associated with a particle, or in an alternative embodiment, only a part of the LEDs of the second luminescent element is radiationally coupled to a particle of the second luminescent element.

The invention claimed is:

1. A lighting device comprising:
   a first set of light emitting diodes arranged to emit light in a first blue wavelength range of 380 nm-490 nm,
   a second set of light emitting diodes arranged to emit light in a second blue wavelength range of 380 nm-490 nm,
   a first luminescent element radiationally coupled to the first and second sets of light emitting diodes and arranged to convert at least a part of the light of the first wavelength range and at least a part of the light of the second wavelength range into first luminescent element light,
   a second luminescent element radiationally coupled to at least a subset of the second set of light emitting diodes and arranged to convert at least a part of the light of the second wavelength range into second luminescent element light,
   wherein the second luminescent element comprises a plurality of discrete luminescent elements arranged downstream of the first luminescent element and that are aligned with at least a subset of the second set of light emitting diodes, and
   wherein, during operation, a brightness level of the light emitted by the first set of light emitting diodes and a brightness level of the light emitted by the second set of light emitting diodes, respectively, are controllable independently and wherein the lighting device is arranged to generate white lighting device light, and wherein the lighting device light is within 15 standard deviation of color matching from the black body locus during operation of the lighting device.

2. The lighting device according to claim 1, wherein the first set of light emitting diodes and the second set of light emitting diodes are mounted on a board that provides the electrical connections for driving the lighting device.

3. The lighting device according to claim 1, wherein the lighting device light is within 10 standard deviation of color matching, from the black body locus during operation of the lighting device.

4. The lighting device according to claim 3, wherein the lighting device light is white in a range of a correlated color temperature from 2100 K to 4500 K, during operation of the lighting device.

5. The lighting device according to claim 1, wherein the first luminescent element comprises at least one first luminescent material from the group of a yellow light emitting luminescent material, a green light emitting luminescent material, and a yellow/green light emitting luminescent material.

6. The lighting device according to claim 1, wherein the second luminescent element comprises at least one second luminescent material from the group of a red light emitting luminescent material, an orange light emitting luminescent material, and an orange/red light emitting luminescent material.

7. The lighting device according to claim 5, wherein the first luminescent element comprises a further luminescent material from the group of a red light emitting luminescent material, an orange light emitting luminescent material, and an orange/red light emitting luminescent material.

8. The lighting device according to claim 5, wherein:
   the first luminescent element comprises a layer covering the first and second sets of light emitting diodes, the layer comprising the at least one first luminescent material.

9. The lighting device according to claim 6, wherein the discrete luminescent elements of the second luminescent element comprise a matrix material in which the at least one second luminescent material is distributed.

10. The lighting device according to claim 8, wherein the layer comprises a matrix material which comprises the at least one first luminescent material.

11. A lighting module comprising the lighting device according to claim 1.

12. A lamp comprising the lighting device according to claim 1.

13. A luminaire comprising the lighting device according to claim 1.

14. A method for producing a lighting device, the method comprising:
   arranging a first set of light emitting diodes adapted to emit light in a first blue wavelength range of 380 nm-490 nm on a board,
   arranging a second set of light emitting diodes adapted to emit light in a second blue wavelength range of 380 nm-490 nm on the board, the second set of light emitting diodes being controllable independently of the first set of light emitting diodes,
   depositing a first luminescent layer on the first and second sets of light emitting diodes thereby providing a first luminescent element, wherein the first luminescent layer comprises at least one luminescent material for converting at least a part of the light of the first wavelength range and at least a part of the light of the second wavelength range into first luminescent element light,
   depositing a plurality of discrete luminescent elements downstream of the first luminescent layer thereby providing a second luminescent element, the discrete luminescent elements comprising a matrix material in which at least one luminescent material is distributed, the discrete luminescent elements being radiationally coupled to at least a subset of the second set of light emitting diodes and arranged to convert at least a part of the light of the second wavelength range into second luminescent element light, wherein the first luminescent element and the second luminescent element are selected such that the correlated color temperature of the lighting device light that is generated by the first and second sets of the light emitting diodes, when operating at full brightness, in combination with the first luminescent element and the second luminescent element is within 15 standard deviation of color matching from the black body locus during operation of the lighting device.

* * * * *